(12) United States Patent
Nakano

(10) Patent No.: US 6,505,941 B2
(45) Date of Patent: Jan. 14, 2003

(54) HANDLE ATTACHMENT STRUCTURE AND PROJECTOR

(75) Inventor: Hirohisa Nakano, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/960,373

(22) Filed: Sep. 24, 2001

(65) Prior Publication Data

US 2002/0036755 A1 Mar. 28, 2002

(30) Foreign Application Priority Data

Sep. 27, 2000 (JP) ........................................ 2000-294687

(51) Int. Cl.[7] .............................................. G03B 21/00
(52) U.S. Cl. ......................................... 353/119; 16/408
(58) Field of Search ............................... 353/119, 122; 16/408, 409, 903, DIG. 40; 190/39; 220/318

(56) References Cited

U.S. PATENT DOCUMENTS

| 3,793,674 A | * | 2/1974 | Kneier | 16/409 |
| 4,157,763 A | * | 6/1979 | Betlejewski et al. | 16/405 |
| 5,382,991 A | * | 1/1995 | Rodriguez et al. | 353/119 |
| 6,257,729 B1 | * | 7/2001 | Kurosawa | 353/119 |

* cited by examiner

*Primary Examiner*—William C. Dowling
(74) *Attorney, Agent, or Firm*—Oliff & Berridge, PLC

(57) ABSTRACT

A handle opening is formed by cutting a part of an exterior case, a rising portion is formed by bending the case toward inside of a casing along cutting periphery of the handle opening, a shaft member for rotatably supporting the handle is inserted to an attachment hole formed on the rising portion, and a screening member for covering the handle opening from the inside of the casing is engaged to the rising portion, thereby covering the gap between the handle and the rising portion by the screening member to improve appearance after attaching the handle.

16 Claims, 10 Drawing Sheets

HANDLE ATTACHMENT STRUCTURE AND PROJECTOR

BACKGROUND OF THE INVENTION

1. Field of the Invention

The present invention relates to a handle attachment structure for rotatably attaching a handle to a casing, and a projector provided with the handle attachment structure.

2. Description of the Related Art

Conventionally, a projector for modulating a light beam irradiated from a light source in accordance with image information to form an optical image and to enlarge and project the optical image has been used.

Such projector and other electronic devices have a casing for accommodating an optical lens, an electronic component and other components. Some of the casings are provided with a handle (grip) for enhancing portability thereof.

The handle is generally formed in C-shape and both ends thereof are rotatably supported to the casing through a shaft member.

The casing of projector and other electronic devices are often made of plastics because of processibility. Inside of such plastic-made casing is plated.

Since effective utilization of resources has come to be required recently, it is preferable that the electronic devices including projector are made of recyclable material.

Accordingly, instead of the composite material of plastics and inner plating, the casing may be formed by recyclable metal.

In order to form the component by the metal material, the thin sheet metal plate working is conducted by a press etc. or, alternatively, molten metal is injected by die-casting molding.

When the casing is shaped by a press using a metal plate of a predetermined thickness, the component can be inexpensively manufactured as compared to die-casting because a metal plate is used, and since the component is simply processed using a press die, yield rate of the component can be improved. Accordingly, the casing is preferably shaped by sheet metal working.

However, since the casing is made of thin metal plate and a shaft member is attached thereto in attaching a handle to the casing made of sheet metal, the attachment work may not be conducted easily and appearance after attachment is not so good because the inside of the casing is seen from a gap between the casing and the handle.

SUMMARY OF THE INVENTION

An object of the present invention is to provide a handle attachment structure and a projector capable of easily attaching the handle to the casing with good appearance in forming the casing by a sheet metal.

A handle attachment structure according to the present invention is for rotatably attaching a handle to a metal casing formed by sheet metal working, which includes: a cut-out portion formed by cutting a part of the casing; a rising portion formed by drawing or bending the casing toward the inside of the casing along the cut periphery of the cut-out portion; a shaft member inserted to an attachment hole formed on the rising portion for rotatably supporting the handle; and a screening member engaged to the rising portion for covering the cut-out portion from the inside of the casing.

According to the present invention, the cut-out portion is formed on the casing by sheet metal working, the rising portion is formed along the cut periphery of the cut-out portion and the attachment hole is formed on the rising portion. The shaft member having attached with the handle is inserted to the attachment hole.

Since the inside of the casing can be seen from the gap between the handle and the rising portion in this condition, the screening member is engaged to the rising portion to close the gap by the screening member.

Accordingly, in the present invention, the handle attachment portion can be easily formed on the metal casing by sheet metal working and the handle can be easily attached to the casing through the shaft member. Further, since the cut-out portion is covered by the screening member from the inside of the casing, the inside of the device cannot be seen from the cut-out portion, thus improving the appearance after attaching the handle.

In the present invention, the shaft member may preferably be made of metal and include a rotation restricting mechanism for restricting a rotation of the shaft member.

Since both of the shaft member and the casing are made of metal, frictional sound is caused by rubbing the metal components when the shaft member rotates relative to the casing. However, according to the above arrangement of the present invention, since the rotation of the shaft member relative to the casing can be prevented by the rotation restricting mechanism, the frictional sound can be prevented from generating. Further, shaky movement of the shaft member relative to the casing in accordance with friction can also be prevented.

In the present invention, the rotation restricting mechanism may preferably include a flat surface formed on an end of the shaft member and a contact surface formed on the screening member to be in contact with the flat surface for restricting the rotation of the shaft member.

According to the above arrangement, the flat surface can be easily formed by squashing or grinding the end of the shaft member. Since the contact surface to be in contact with the flat surface is formed on the screening member, extra components can be omitted to simplify the structure of the rotation restricting mechanism.

In the present invention, the screening member may preferably be provided with an insert hole for the shaft member to be inserted and a fall-off preventing member for preventing the shaft member from dropping off the insert hole.

According to the above arrangement of the present invention, since the shaft member does not erroneously drop off from the insert hole of the screening member on account of the fall-off preventing member, the screening member is not detached from the rising portion.

In the present invention, the fall-off preventing member may preferably include a flexible member being in contact with axial end surface of the shaft member and deforming toward outside in radial direction when the shaft member is attached.

According to the above arrangement, the shaft member is attached when the screening member is attached to the rising portion of the casing and, simultaneous with attaching the shaft member, the fall-off preventing member is also attached. In other words, two originally independent works can be conducted by attaching the shaft member, thereby improving productivity.

In the present invention, the flat surface of the shaft member may preferably be formed by squashing the distal end of the shaft member to be larger than the shaft diameter thereof, and the fall-off preventing member may preferably include a position restricting surface to be in contact with the end surface of the distal end of the shaft formed with the flat surface.

According to the above arrangement of the present invention, since the flat surface restricts in a direction for the shaft member to enter the insert hole and the position restricting surface restricts in a direction for the shaft member go out of the insert hole, the structure of the screening member can be simplified.

In the present invention, an air intake hole for introducing cooling air into the casing may preferably be provided to the screening member.

For accommodating a heat-generating electric device such as a light in the casing, the inside of the casing has to be cooled. However, since the air intake hole is formed on the screening member in the above arrangement, the cooling air can be introduced to the inside of the casing through the air intake hole even without cooling air introducing hole is not formed on the casing.

The outer surfaces of the handle and the casing may preferably be respectively coated and a projecting step portion projecting toward outer direction relative to the coated surface and having no coating may preferably be formed on at least one of the handle and a portion of the casing to be engaged to the handle.

According to the above arrangement, since the handle and the casing are coated, durability can be improved. Further, since the projecting step portion is formed on at least one of the handle and the casing, on the handle for instance, sound generated by rubbing the coated surfaces of the casing and the handle can be prevented.

A projector may be constructed including the handle attachment structure of the above-described arrangement.

According to the above aspect of the present invention, a projector capable of easily attaching the handle to the casing with good appearance can be provided.

DETAILED DESCRIPTION OF PREFERRED EMBODIMENT(S)

An embodiment of the present invention will be described below with reference to attached drawings.

[1. Primary Arrangement of Projector]

Figure 1:
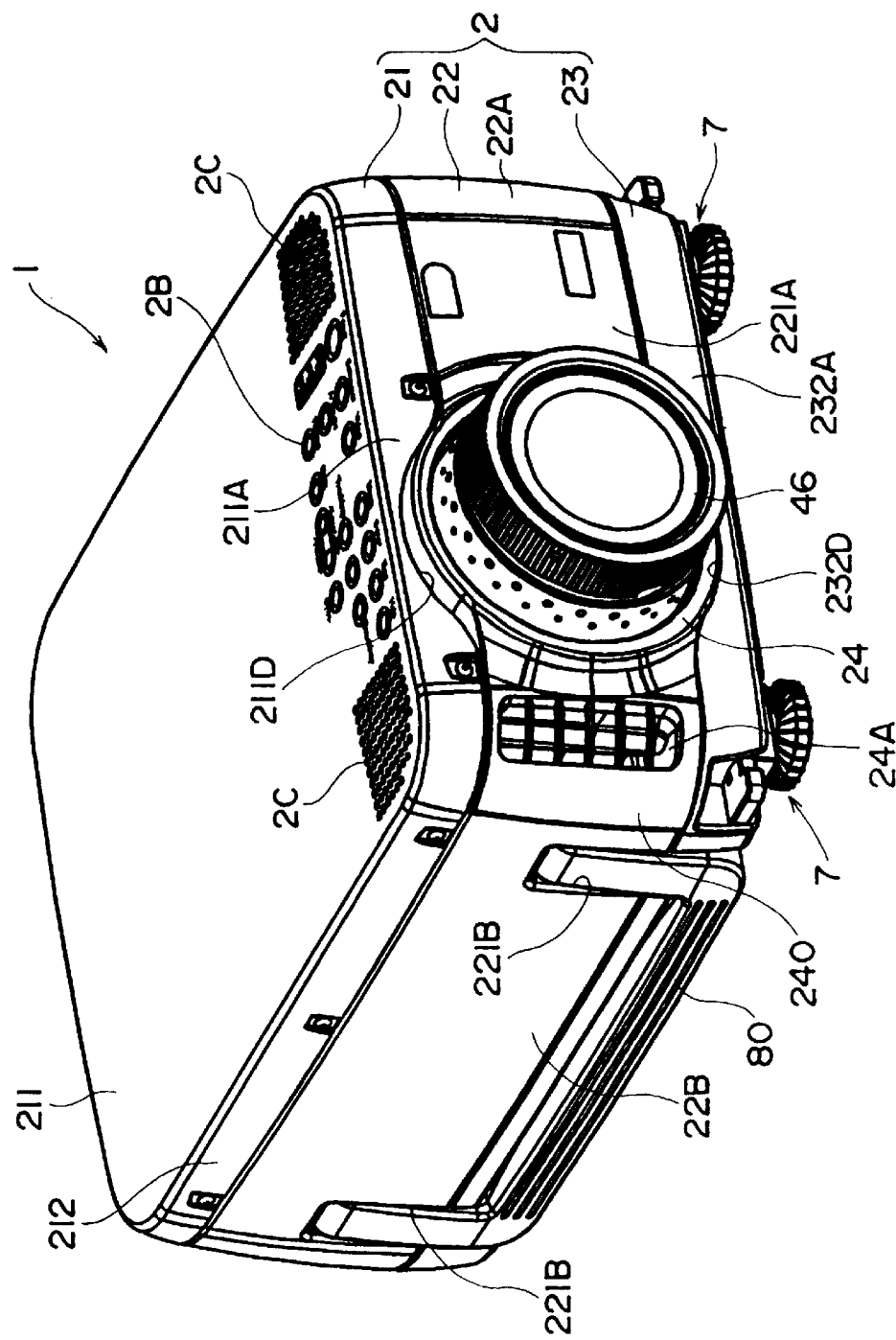
FIG. 1 is an entire perspective view of a projector according to an embodiment of the present invention seen from above.
Figure 2:
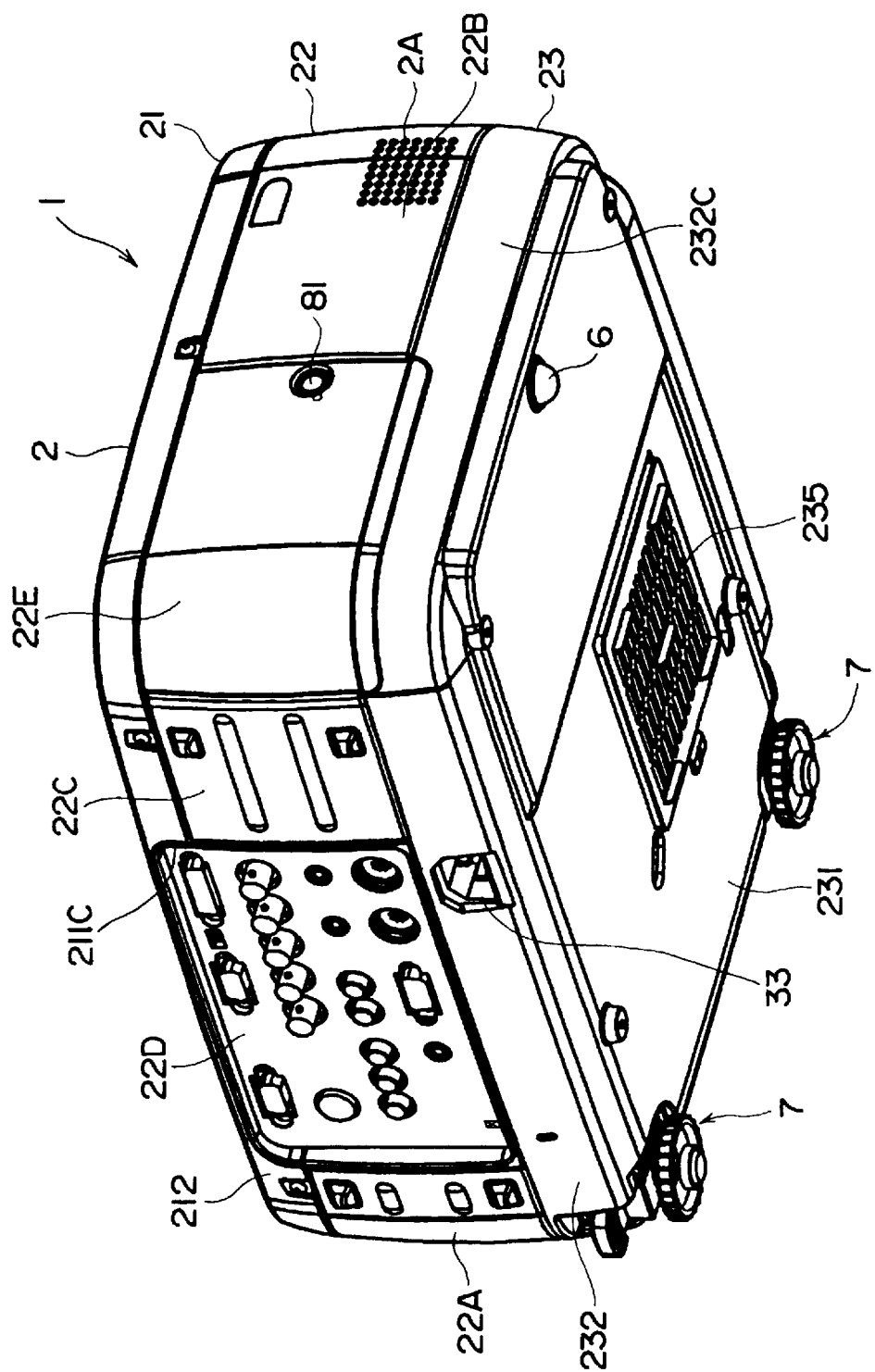
FIG. 2 is an entire perspective view of the projector according to the aforesaid embodiment seen from below.
Figure 3:
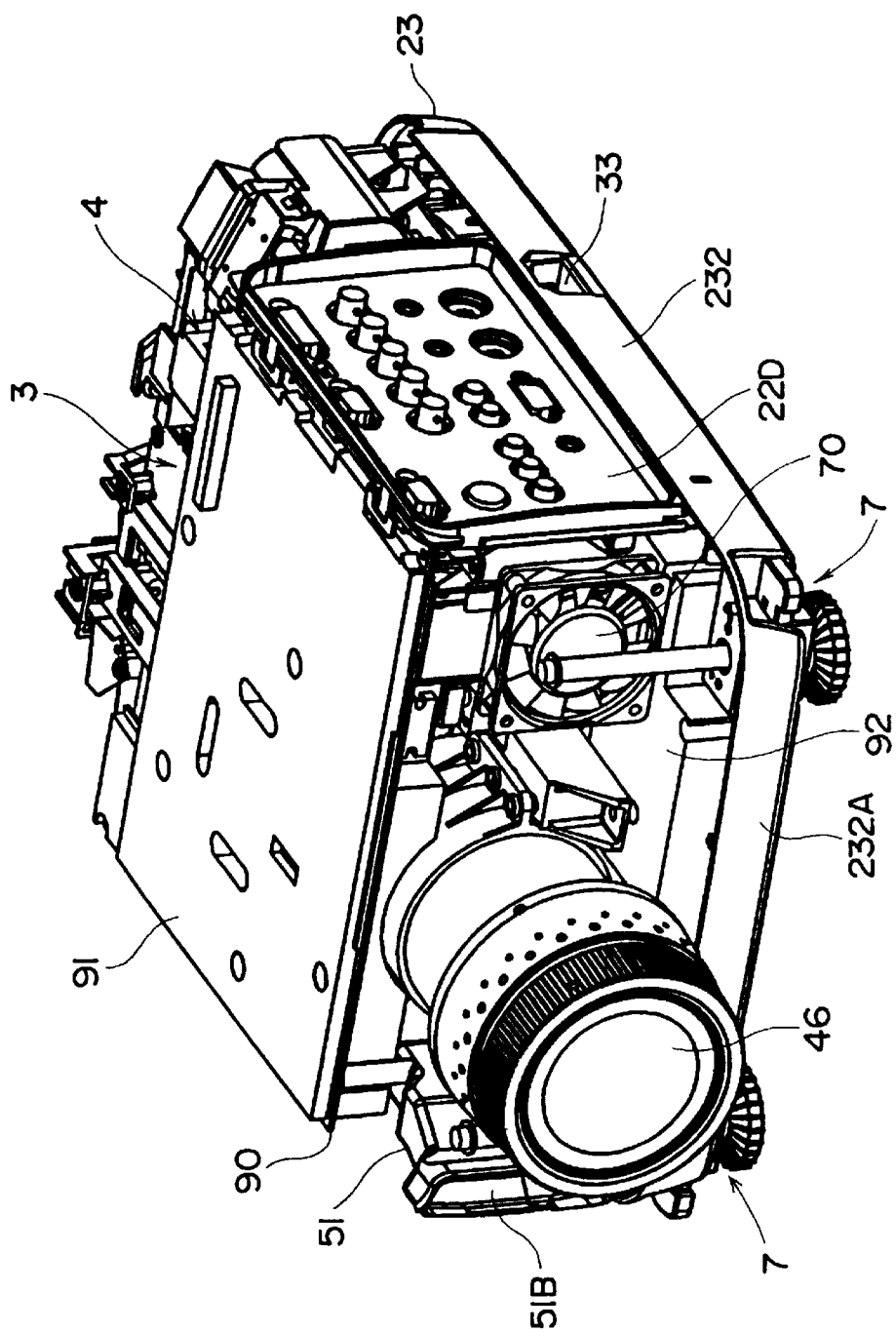
FIG. 3 is an entire perspective view showing an inside of the projector of the aforesaid embodiment.

FIG. 1 is an entire perspective view of a projector 1 according to the present embodiment seen from above, FIG. 2 is an entire perspective view of the projector 1 according to the present embodiment seen from below, and FIG. 3 is an entire perspective view showing an inside of the projector 1.

In FIGS. 1 to 3, a projector 1 has an exterior case 2 as a casing, a power supply unit 3 accommodated in the exterior case 2, and an optical unit 4 of planarly L-shape disposed in the exterior case 2, the entirety of the projector 1 being approximate rectangular solid.

The exterior case 2 includes a sheet-metal upper case 21, a middle case 22 made of bent aluminum or steel plate, and a lower case 23 made of die casting such as magnesium. The cases 21, 22 and 23 are mutually fixed by a screw.

The upper case 21 is formed of an upper portion 211 and a side portion 212 disposed around the upper portion 211, which is, for instance, shaped by a press using a die.

A circular hole 211D corresponding to a lens attachment frame 24 for attaching a projection lens 46 is provided to a front portion 211A side of the side portion 212, the neighborhood of the circular hole 211D being curved inwardly by drawing. A notch 211C (see FIG. 2) is formed on a side orthogonal with the front portion 211A of the side portion 212.

The middle case 22 is, as described above, formed by bending aluminum plates etc., which includes a fist case member 22A and a second case member 22B disposed on both sides of the projection lens 46, and a third case member at the back of the first case member 22A. An interface board 22D exposing various connectors for an interface is disposed and connected between the first case member 22A and the third case member 22C and an openable and closable lamp cover 22E is provided between the second case member 22B and the third case member 22C.

The respective case members 22A, 22B and 22C have a configuration capable of being combined with the upper case 21 and the lower case 23 by bending the aluminum plates having a predetermined configuration blanked by a press or a machining center.

An opening (not shown) corresponding to the lens attachment frame 24 is formed on opposing sides of the first case member 22A and the second case member 22B on a side of front 221A of the middle case 22. Another opening (not shown) is formed on the front 221A side of the second case member 22B, which opposes an exhaust hole 24A formed on the lens attachment frame 24.

The lens attachment frame 24 is attached to the middle case 22 to form the middle case 22. Incidentally, a cover 240 made of, for instance, plastic, is attached around the exhaust hole 24A.

Handle openings 221B as cut-out portions extending from the lower case 23 toward the upper case 21 by a predetermined distance spaced apart with each other are provided to the second case member 22B. A C-shape handle 80 is attached to the openings 221B.

As shown in FIG. 2, the lamp cover 22E has a knob 81 such as a screw on the second case member 22B side and is engaged to the peripheral end of the third case member 22C. The knob 81 is screwed to a nut (not shown) formed on the second case member 22B through an E ring. When the knob 81 is rotated to release screwing with the nut, the knob 81 projects to the outside from the lamp cover 22E by the amount being screwed. When the knob 81 is held to slide the lamp cover 22E along the side of the projector 1, the lamp cover 22E can be detached. Incidentally, since the knob 81 is supported by the E ring, the knob 81 is not detached from the lamp cover 22E even after releasing to screw with the nut.

As mentioned above, the lower case 23 is a die-casting of magnesium etc., where an approximately rectangular bottom portion 231 and a side portion 232 around the bottom portion are integrally formed. A reinforcing rib etc. is formed at a predetermined location inside the lower case 23, thereby securing strength of the entire lower case 23.

A height position adjuster 7 for adjusting inclination of the entire projector 1 to adjust position of the projected image is provided on both corners of front side of the bottom portion 231 of the lower case 23. On the other hand, a resin-made foot member 6 (FIG. 2) is fitted to the rear center of the bottom portion 231. A fan cover 235 is attached to the bottom portion 231 of the lower case 23. A circular hole 232D corresponding to the lens attachment frame 24 is provided to a front portion 232A of the lower case 23.

An intake hole 2A for introducing cooling air to the inside, an exhaust hole 24A for exhausting the air after cooling, the operation switch 2B, the multiple holes 2C corresponding to positions of the speaker and the handle opening 221B are provided to the exterior case 2. Incidentally, the cooling air is introduced to the inside from the handle opening 221B.

Figure 5:
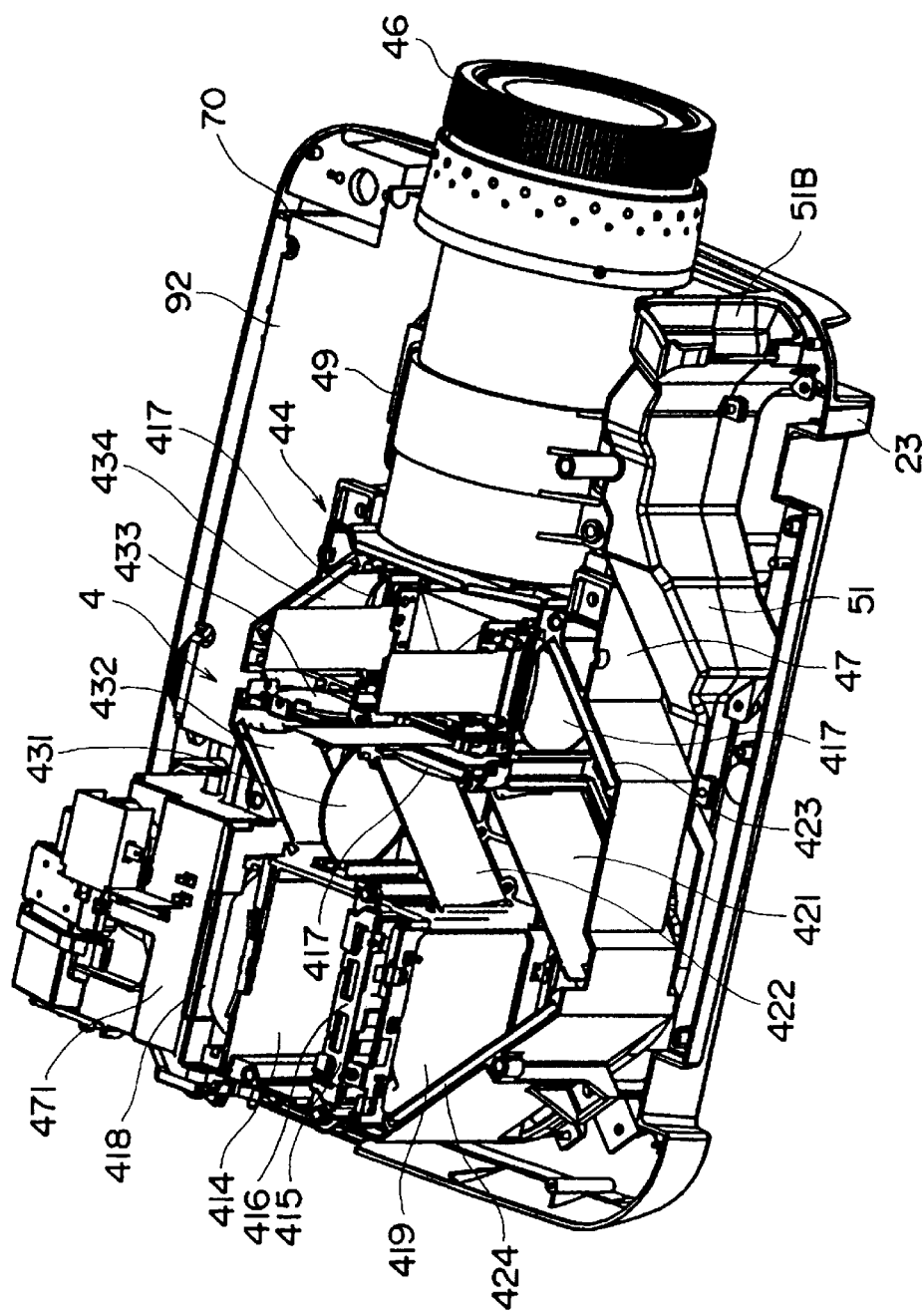
FIG. 5 is a perspective view showing components of the projector of the aforesaid embodiment.

As shown in FIG. 5, the power unit 3 is composed of a main power supply (not shown) disposed on the bottom side in the exterior case 2 and a ballast disposed above the main power supply. The main power supply supplies electric power supplied through a power cable to the ballast and a driver board (not shown), which includes an inlet connector 33 for the power cable to be plugged (FIG. 3), an aluminum frame (not shown) surrounding the main power supply and a power circuit.

The ballast supplies electric power mainly to a light source lamp 411 (FIG. 4) of the optical unit 4 and includes a lamp driving circuit.

Figure 4:
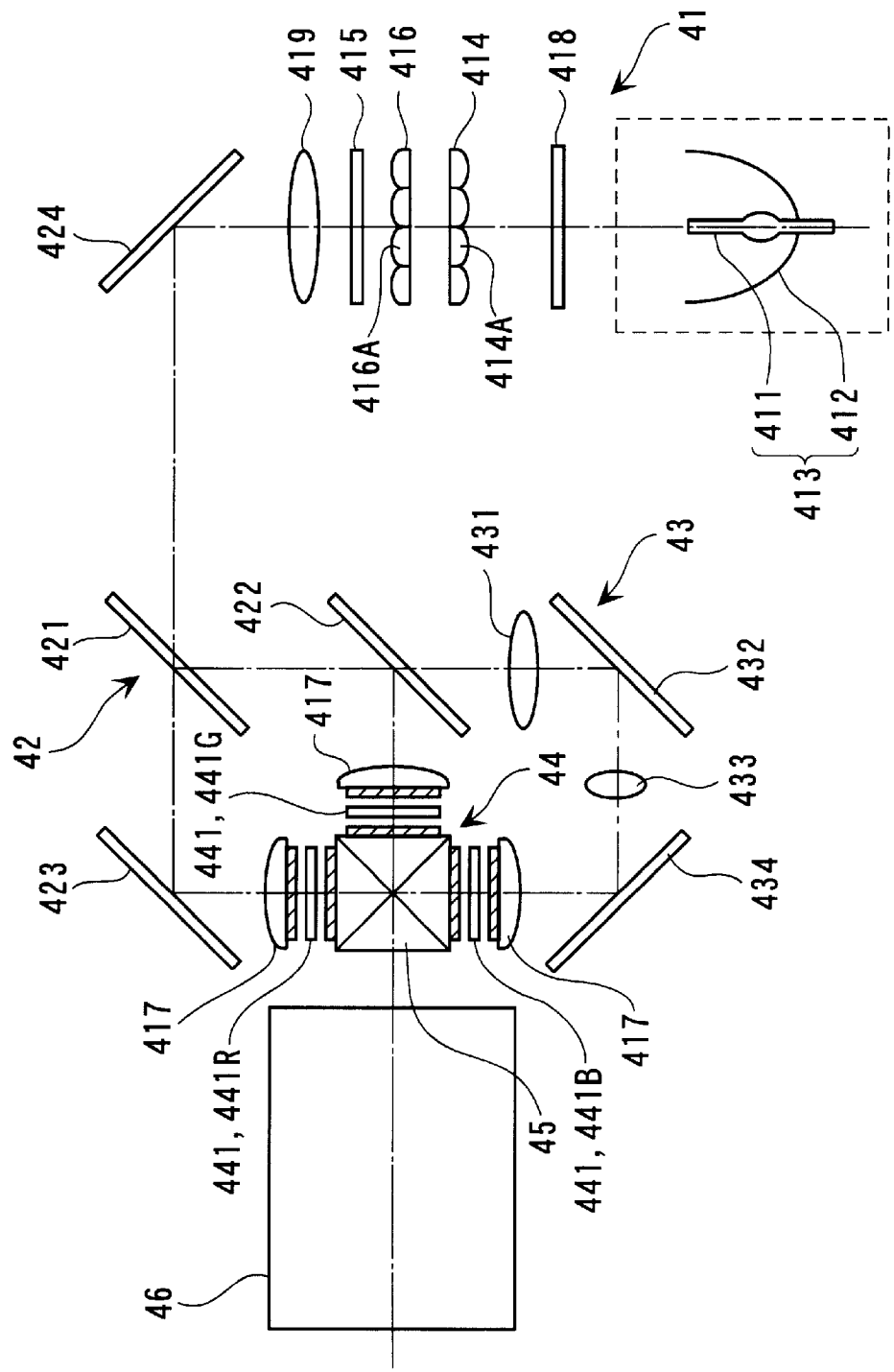
FIG. 4 is a plan view schematically showing respective optical systems of the projector of the aforesaid embodiments.

As shown in FIG. 4, the optical unit 4 optically processes the light beam irradiated from the light source lamp 411 to form an optical image corresponding to the image information, which includes an integrator illuminating optical system 41, a color separating optical system 42, a relay optical system 43, an electric optical device 44, a cross dichroic prism 45 as a color synthesizing optical system and a projection lens 46 as a projection optical system.

[2. Detailed Arrangement of Optical System]

In FIG. 4, the integrator illuminating optical system 41 is an optical system for substantially uniformly illuminating the image formation areas of the three liquid crystal panels 441 (respectively represented as liquid crystal panels 441R, 441G and 441B for each color light of red, green and blue), which includes a light source 413, a UV filter 418, a first lens array 414 as a beam splitter, a second lens array 416, a polarization converter 415, and a reflection mirror 424.

The light source 413 constituting the integrator illuminating optical system 41 has the light source lamp 411 as a radial light source for emitting radial light beam and a reflector 412 for reflecting the radial light emitted from the light source lamp 411. A halogen lamp, a metal halide lamp, or a high-pressure mercury lamp is often used as the light source lamp 411. A parabolic mirror is used as the reflector 412, however, an ellipsoidal mirror and a parallelizing lens (concave lens) may be used.

The first lens array 414 has a matrix arrangement of lenses 414A having substantially rectangular profile viewed from optical axis direction. The respective lenses 414A split the beam emitted from the light source lamp 411 to pass the UV filter 418 into a plurality of partial light beams. The profile of the respective lenses 414A is approximately similar to the configuration of the image formation area of the liquid crystal panel 441. For instance, when the aspect ratio (ratio of horizontal and vertical dimensions) of the liquid crystal panels 441 is 4:3, the aspect ratio of the respective lenses is also set as 4:3.

The second lens array 416 has approximately the same arrangement as the first lens array 414, where the lenses 416A is disposed in matrix. The second lens array 416 focuses the image from the respective lenses 414A of the first lens array 414 onto the liquid crystal panel 441 as well as the superposing lens 419.

The polarization converter 415 is disposed between the second lens array 416 and the superposing lens 419 for converting the light from the second lens array 416 to a single polarized light in order to enhance utilization efficiency of the light in the electric optical device 44.

Specifically, the respective partial light converted into single polarized light by the polarization converter 415 is, finally, substantially superposed on the liquid crystal panels 441R, 441G and 441B of the electric optical device 44 by the superposing lens 419. Since the projector 1 (the electric optical device 44) of the present embodiment using a liquid crystal panel 441 for modulating polarized light can use only single polarized light, approximately half of the light from the light source lamp 411 emitting random polarization light of other type cannot be used.

Accordingly, by using the polarization converter 415, all of the emitted light from the light source lamp 411 is converted into single polarized light to enhance utilization efficiency of the light in the electric optical device 44. Incidentally, such polarization converter 415 is disclosed in, for instance, Japanese Patent Laid-Open publication No. Hei 8-304739.

The color separating optical system 42 has two dichroic mirrors 421 and 422 and a reflection mirror 423, where the mirrors 421 and 422 separates the plurality of partial light beam irradiated from the integrator illuminating optical system 41 into three color lights of red, green and blue.

The relay optical system 43 includes an incident-side lens 431, a relay lens 433 and a reflection mirrors 432 and 434, which introduces blues light of the color lights separated by the color separating optical system 42 into the liquid crystal panel 441B.

The electric optical device 44 has the liquid crystal panels 441R, 441G and 441B as three optical modulators which, for instance, use a polysilicon TFT as switching element. The color lights separated by the color-separating optical systems 42 is modulated by the three crystal panels 441R, 441G and 441B in accordance with image information to form optical image.

The cross dichroic prism 45 synthesizes the images modulated for respective color lights irradiated from the three liquid crystal panels 441R, 441G and 441B to form a color image. Incidentally, a dielectric multilayer film for reflecting red light and another dielectric multilayer film for reflecting blue light are formed on the prism 45 along boundaries of the four right-angled prisms, the dielectric multilayers synthesizing three color lights. The color image synthesized by the prism 45 is irradiated from the projection lens 46 and is enlarged and projected on a screen.

The above-described respective optical systems 41 to 45 are disposed on a lower side of a main board 90 covered with a shield plate 91 as shown in FIGS. 3 and 5 and are accommodated in an inner case 47 (FIG. 5) as a optical component casing made of synthetic resin. Specifically, the inner case 47 is provided with a groove for slidably fitting the respective optical components 414 to 419, 421 to 423 and 431 to 434 from upper direction as well as a light source protector 471 for covering the light source 413.

A head portion 49 is formed on the light-irradiating side of the lower inner case 47. The prism 45 attached with the liquid crystal panels 441R, 441G and 441B is fixed to one end of the head portion 49 and the projection lens 46 is fixed to a flange along semi-cylindrical portion of the other end.

[3. Cooling Mechanism]

Figure 6:
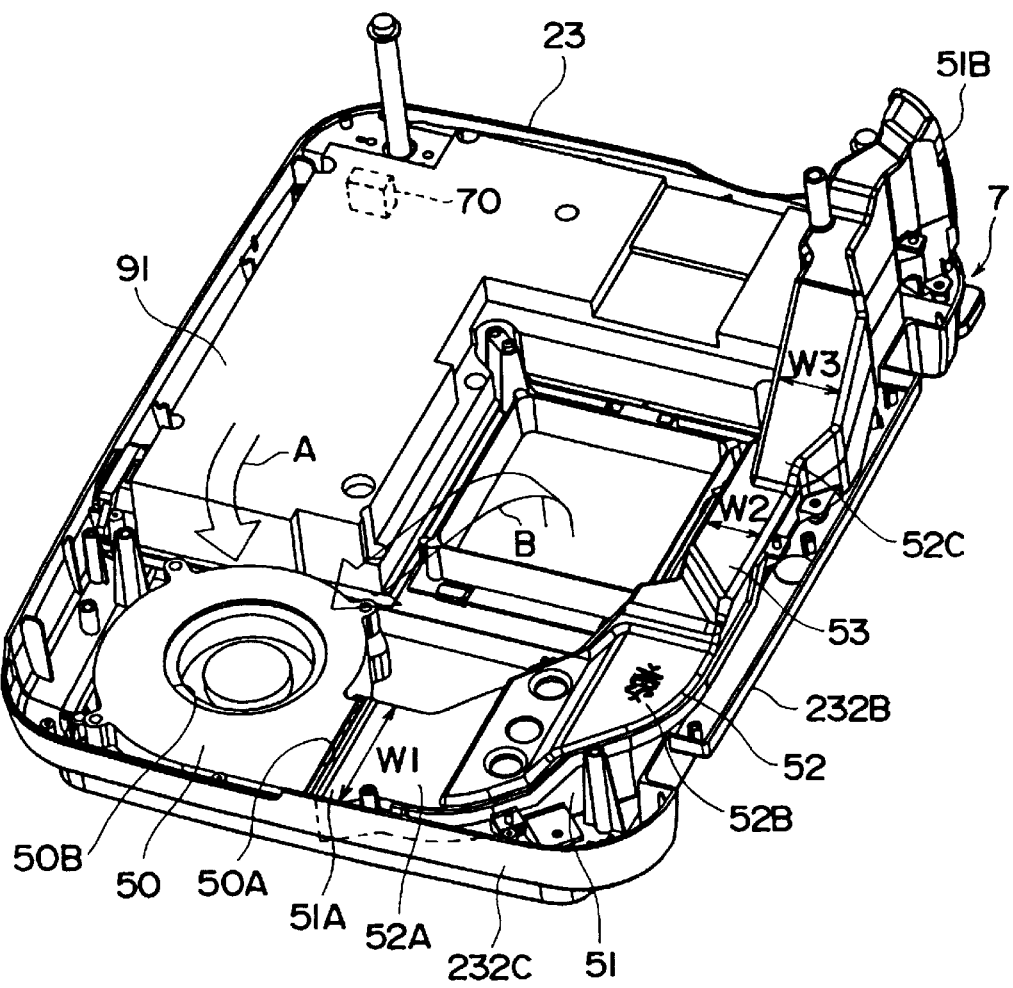
FIG. 6 is a perspective view showing a cooling mechanism of the projector of the aforesaid embodiment.
Figure 7:
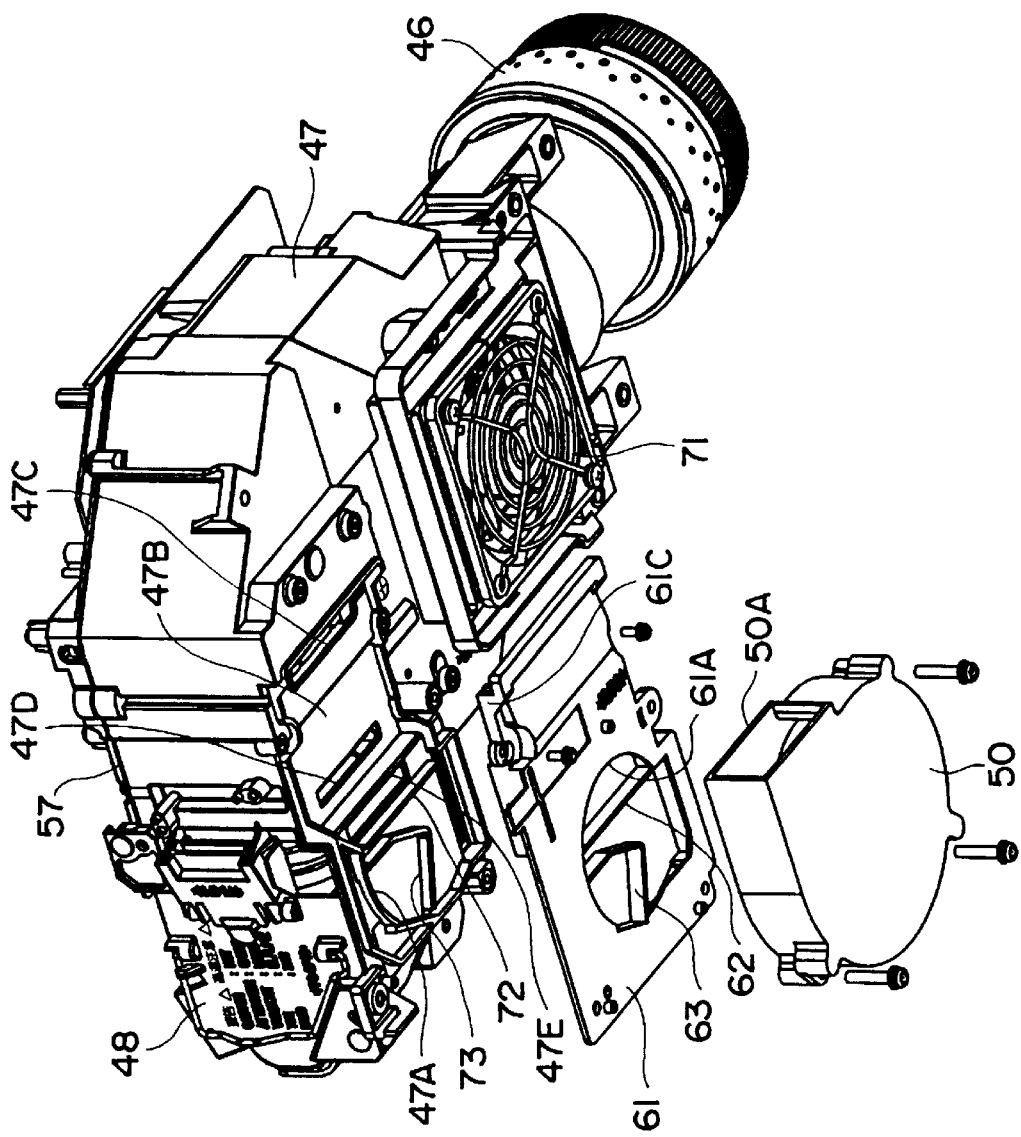
FIG. 7 is a perspective view showing a part of the cooling mechanism of the projector of the aforesaid embodiment seen from below.

In FIGS. 5 to 7, a first cooling system A where the air inhaled by an axial flow suction fan 70 is discharged to the exhaust hole 24A of the lens attachment frame 24 as a part of the exterior case 2 through a sirocco fan 50 as a centrifugal fan and a discharge hole 51B of an exhaust duct 51, a second cooling system B where the cooling air inhaled by a suction fan 71 provided below the optical unit 4 is discharged from the sirocco fan 50 to the exhaust hole 24A of the lens attachment frame 24 through the discharge hole 51B of the exhaust duct 51, and a third cooling system (not shown) where the air inhaled by an intake duct 60 formed between an upper side of the sirocco fan 50 and the inner case 47 as a casing is discharged from the sirocco fan 50 to the exhaust hole 24A of the lens attachment frame 24 through the discharge hole 51B of the exhaust duct 51 are formed in the projector 1.

The sirocco fan 50 and the exhaust duct 51 connected thereto will be described below with reference to FIGS. 5 to 7.

The sirocco fan 50 is formed in a flat disk having an air discharge hole 50A extending in tangent line of the outer circumference, which is provided on a bottom of the lower case 23 near the backside of the lower case 23 and shifted in width direction relative to extension of axial line of the projection lens 46. An air intake 50B of the sirocco fan 50 faces upward and an air discharge hole 50A thereof faces to the extension of the axial line of the projection lens 46.

An end 51A of the exhaust duct 51 is connected to the air discharge hole 50A of the sirocco fan 50. The exhaust duct 51 is made of, for instance, synthetic resin, and is provided along two sides, i.e. a backside 232C and a side 232B of the lower case, which extends toward a neighborhood of the front portion 232A of the lower case 23. The discharge hole 51B is formed on the other end of the exhaust duct 51.

A plurality of bent portions 52 for bending the exhaust flow by the sirocco fan 50 are formed on the exhaust duct 51.

Specifically, the end 51A of the exhaust duct 51 as a connection with the air discharge hole 50A of the sirocco fan 50 horizontally continues from the air exhaust hole 50A in a predetermined length and a first bent portion 52A rising at a bending angle of 45 degrees or less continuously extends from the end of the horizontal portion to the air exhaust hole 51B of the other end of the exhaust duct 51.

A top of the inclination of the first bent portion 52A is planarly bent by approximately 90 degrees from the backside 232C of the lower case 23 along the side 232B, the bent portion being a second bent portion 52B.

A continuous portion 53 continuing to the second bent portion 52B is provided at a part of the exhaust duct 51 along the side 232B of the lower case 23. A third bent portion 52C rising at a bending angle of 45 degrees or less toward the discharge hole 51B on the other end of the exhaust duct 51 is provided on the exhaust side end of the continuous portion 53.

The end 51A and the first bent portion 52A of the exhaust duct 51 have the width (diameter) W1, the width of the continuous portion 53 is W2 narrower than the width W1 and the width of the third bent portion 52C is W3 narrower than the width W2. The height at the respective portions of the width W1, W2 and W3 is the largest at the portion of width W3 and becomes smaller in the order of the widths W2 and W1. However, the area of the cross section stays substantially the same along the entire length of the exhaust duct 51.

In the first cooling system A, the cooling air inhaled from the gap of the lens attachment frame 24, the speaker hole 2C etc. by the axial flow suction fan 70 flows toward and is sucked in by the sirocco fan 50 while cooling the main power supply, the ballast etc. Then, the cooling air is discharged from the exhaust hole 24A of the lens attachment frame 24 toward the outside of the exterior case 2 through the discharge hole 51B of the exhaust duct 51.

In the second cooling system B, the cooling air inhaled from the suction fan 71 covered with the fan cover 235 provided on the backside of the lower case 23 and attached to the lower side of the inner case 47 flows toward the sirocco fan 50 to be sucked in while cooling the cross dichroic prism 45 and the electric optical device 44. Then, the cooling air is discharged from the exhaust hole 24A of the lens attachment frame 24 toward the outside of the exterior case 2 through the discharge hole 51B of the exhaust duct 51.

In the third cooling system C, as shown in FIG. 7, the cooling air inhaled from the opening adjacent to the attachment of the light source lamp unit 48 of the inner case 47 etc. is sent from the intake duct 60 formed between the inner case 47, sirocco fan 50 and the exhaust duct 51 toward the air intake 50B of the sirocco fan 50, and is circulated through the sirocco fan 50 and the exhaust duct 51 to be discharged from the discharge hole 51B of the exhaust duct 51 toward the outside of the projector 1 through the exhaust hole 24A of the lens attachment frame 24.

A lid member 61 is provided at a space forming the intake duct 60 between the inner case 47 and the sirocco fan 50, and the exhaust duct 51. An opening 61A is formed on the lid member 61 corresponding to the air intake 50B of the sirocco fan 50. The lid member 61 is fixed by screwing to the lower side of the inner case 47.

As shown in FIG. 7, a first lower partition member 62 projecting toward the lower side of the inner case 47 spanning over the opening 61A, a second lower partition member 63 as a partition for the light source and an upper frame 64 are integrally formed on the upper side of the lid member 61. The first lower partition member 62 is provided along width direction of the lid member 61. The second lower partition member 63 is formed in approximate L-shape with a part of the side thereof being parallel to the first lower partition member 62.

An end of the lid member 61 on the side of the exhaust duct 51 rises in a gentle inclination and a rising portion 61B is formed on the distal end thereof. A side portion 61C (see FIG. 7) continuing to the rising portion 61B is provided on a part of the upper side of the lid member 61 in succession from the rising portion 61B to the first lower partition member 62, the rising portion 61B and the side portion 61C forming a frame.

A light source lamp unit 48 is detachably attached to a corner of the inner case 47 disposed above the sirocco fan 50 and the exhaust duct 50. The light source lamp unit 48 accommodates the light source lamp 411 etc. therein.

On the other hand, a concave portion 47B is formed on a part of the bottom backside of the inner case 47 and an exhaust opening 47A is formed on the bottom backside continuing from the concave portion 47B. A first upper partition member 72 projecting toward the lid member 61, a second upper partition member 73 as a light source partition and a lower frame 74 are formed on the bottom backside of the inner case 47. The respective ends of the first upper partition member 72 and the first lower partition member 62, the second upper partition member 73 and the second lower partition member 63, the lower frame 74 and the upper frame 64 respectively contact with each other.

The frame formed by the rising portion 61B and the side portion 61C of the lid member 61 is fitted to a space defined by the concave portion 47B, the first upper partition member 72 and the first lower partition member 62. Accordingly, the space between the lid member 61 and the inner case 47, in other words, the space between the exhaust duct 51 and the inner case 47, is surrounded by a frame, the space defining the intake duct 60 which continues to the opening 61A of the lid member 61 and the air intake 50B of the sirocco fan 50.

A narrow first lower opening 47C and a second lower opening 47D are formed on the bottom of the inner case 47 with a predetermined interval. A third lower opening 47E is formed between the first upper partition member 72 and the second lower opening 47D.

On the other hand, a first upper opening 57C and a second upper opening 57D corresponding to the first lower opening 47C and the second lower opening 47D are formed on the upper light guide 57.

[4. Handle Attachment Structure]

Figure 8:
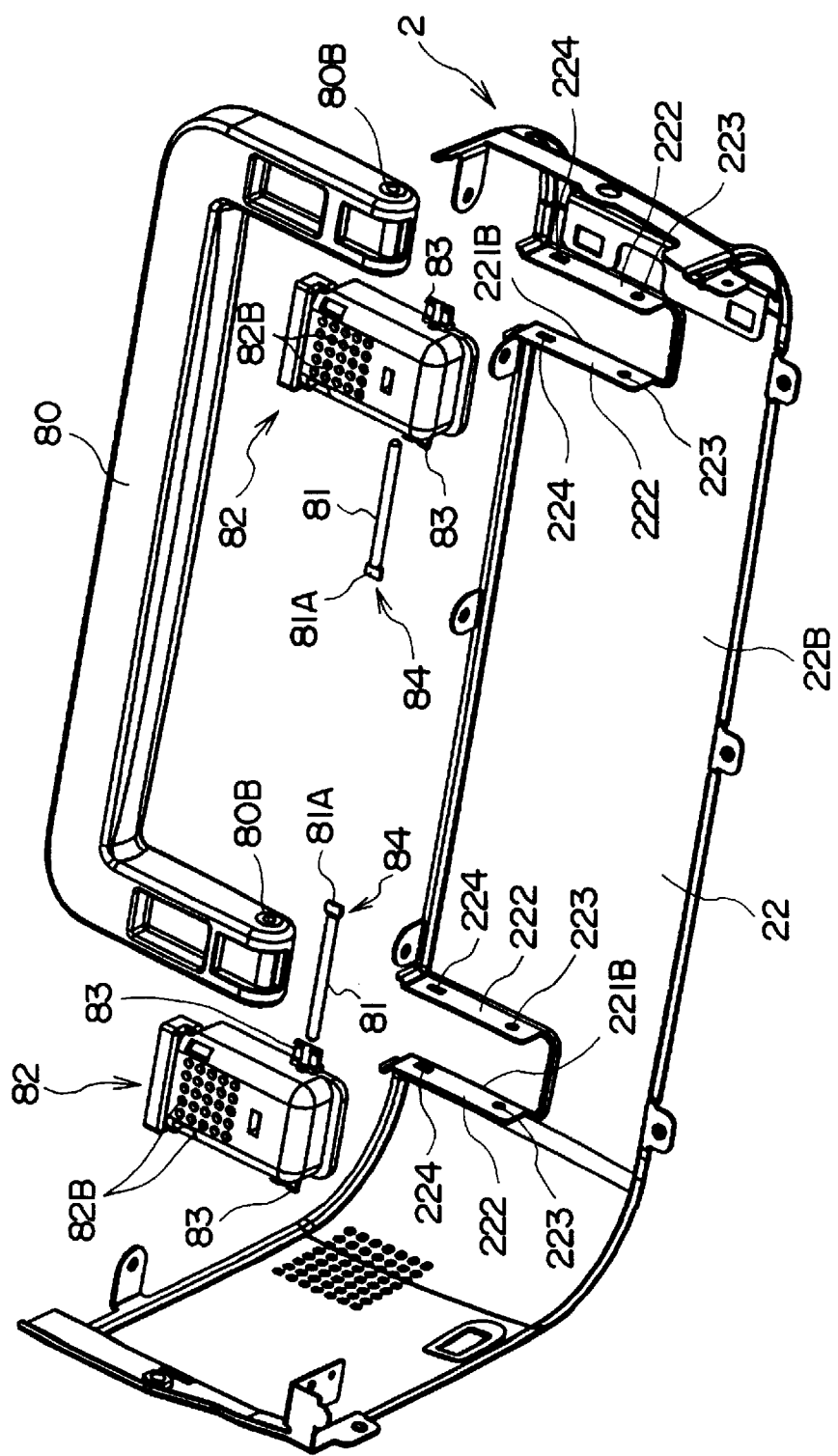
FIG. 8 is an exploded perspective view showing a handle attachment structure.
Figure 9:
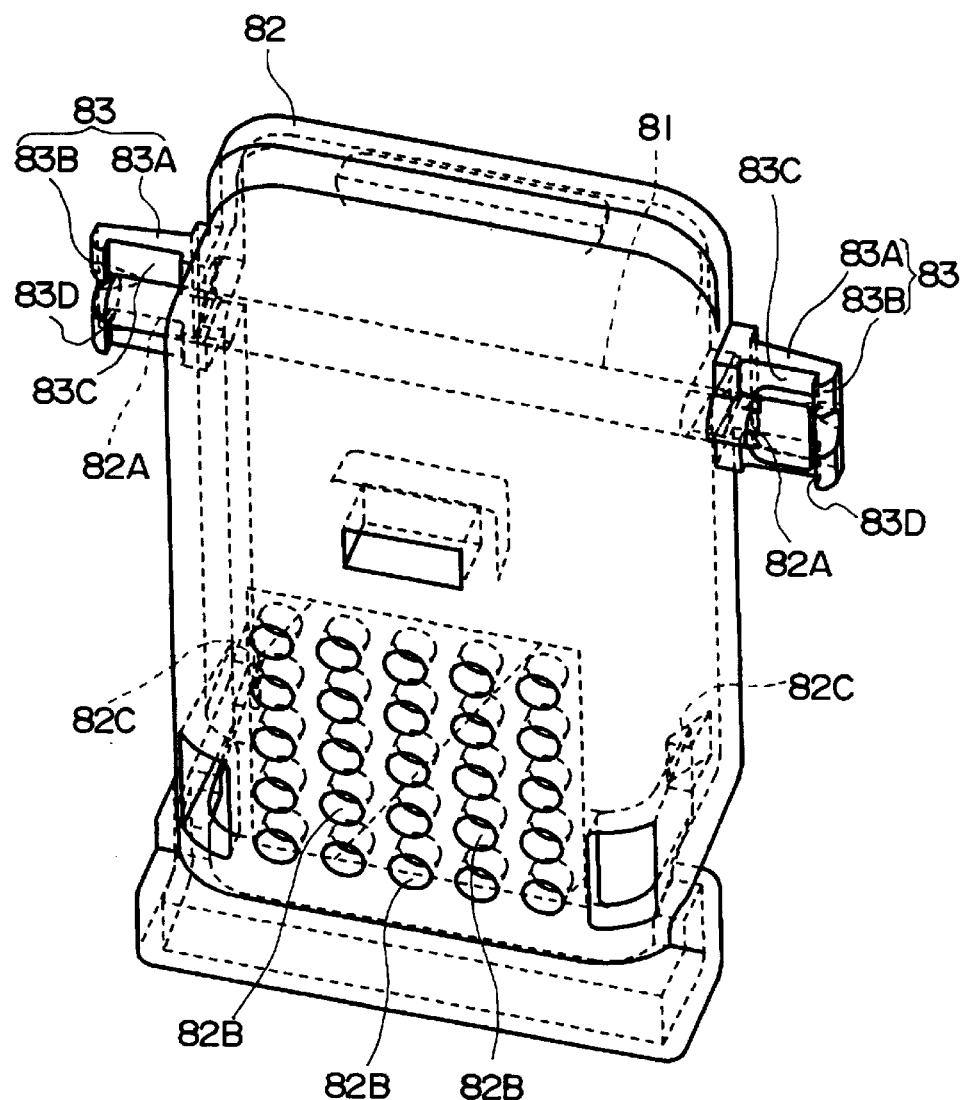
FIG. 9 is a perspective view showing a screening member.
Figure 10:
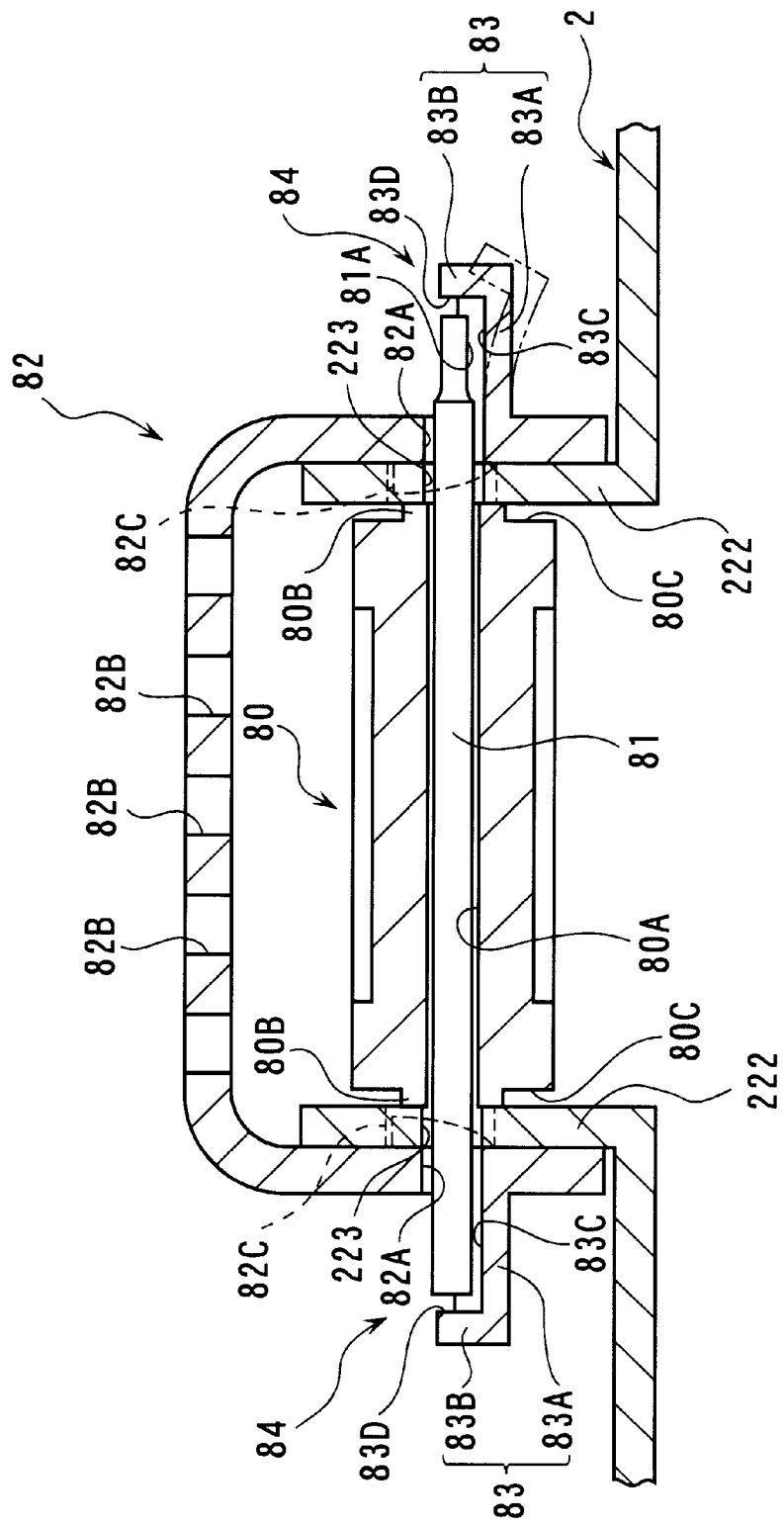
FIG. 10 is a cross section showing the handle attachment structure.

FIGS. 8 to 10 show the structure for attaching the handle 80 to the exterior case 2. FIG. 8 is an exploded perspective view showing how the handle 80 is attached to the exterior case 2.

In FIG. 8, the handle openings 221B as cut-out portions are formed on the middle case 22 of the exterior case 2 mutually spaced apart by a predetermined distance. The handle openings 221B are respectively in rectangular form, and a rising portion 222 is formed along the rectangular cut-out periphery of the handle opening 221B being bent toward the inside of the case.

The rising portions 222 are mutually opposed on both peripheral sides of the handle openings 221B. A circular attachment hole 223 is formed at the center in width direction of the middle case 22, and a rectangular engaging hole 224 is formed on the end in width direction of the middle case 22.

The attachment holes 223 and the engaging holes 224 are mutually opposed sandwiching the handle openings 221B. A metal shaft member 81 for rotatably supporting the handle 80 is inserted to the attachment holes 223. The shaft member 81 is formed in approximate circular shaft, and has an end being squashed in radial direction to be a flat surface 81A. The flat surface 81A is wider than the shaft diameter of the shaft member 81.

A plastic-made screening member 82 covering the handle opening 221B from the inside of the case engages to the rising portion 222.

Detailed arrangement of the screening member 82 is shown in FIG. 9 and a cross section of the attachment structure of the handle 80 is shown in FIG. 10.

In FIGS. 9 and 10, the screening member 82 is formed in a cup-shape large enough to cover the handle opening 221B including the mutually opposing rising portions 222. An insert hole 82A for the shaft member 81 to be inserted is formed on the mutually opposing sides of the screening member 82 and a plurality of air intake holes 82B for introducing cooling air into the inside of the casing are formed on the flat portion thereof. An end of the screening member 82 on the handle 80 side is opened for avoiding interference with the handle 80.

Engaging projections 82C to be engaged to the engaging hole 224 of the rising portion 222 are mutually opposed on two locations of the inner sides of the screening member 82.

A fall-out preventing member 83 for preventing the shaft member 81 from dropping out from the insert hole 82A is provided around the insert hole 82A of the screening member 82.

The fall-out preventing member 83 includes an arm 83A extending in a axis-center direction of the insert hole 82A from the side of the screening member 82 and an engaging portion 83B formed on the distal end of the arm 83A at a right angle. The fall-out preventing member 83 is formed by a flexible member such as elastic plastic to be radially deformed toward outside (see the imaginary line of FIG. 10) when the shaft member 81 is attached, which may be formed by a material the same as or different from the screening member 82.

An upper surface of the arm 83A is a contact surface 83C to be in contact with the end of the flat surface 81A formed at the end of the shaft member 81 for restricting the rotation of the shaft member 81. The inner side of the engaging portion 83B is a position restricting surface 83D to be in contact with the end of the axis of the shaft member 81.

The flat surface 81A formed on the end of the shaft member 81 and the contact surface 83C provided on the screening member 82 constitute a rotation restricting mechanism 84 for restricting the rotation of the shaft member 81.

As shown in FIG. 10, a hole 80A for the shaft member 81 to be inserted is formed on the handle 80, and a projecting step portion 80B projects from an opening side of the hole 80A relative to an end surface 80C. The surface of the handle 80 is coated except for the projecting step portion 80B.

Outer surface of the exterior case 2 including the rising portion 222 is coated.

According to the above-described embodiment, following effects can be obtained.

(1) Since the handle 80 is rotatably attached to the metal exterior case 2 formed by sheet metal working, the projector 1 can be easily carried by holding the handle 80.

(2) Since the handle opening 221B is formed by cutting a part of the exterior case 2 and the cutting periphery of the handle opening 221B is bent toward the inside of the casing to form the rising portion 222, and since the shaft member 81 for rotatably supporting the handle 80 is inserted to the attachment hole 223 formed on the rising portion 222 and the screening member 82 for covering the handle opening 221B from the inside of the case is engaged to the rising portion 222, the formation of the handle opening 221B, the rising portion 222 and the attachment hole can be respectively conducted by sheet metal working, thereby facilitating shaping of the exterior case 2. Further, since the gap between the handle 80 and the rising portion 222 can be covered by the screening member 82, the appearance after attaching the handle can be improved.

(3) Since the rotation restricting mechanism 84 for restricting the rotation of the metal shaft member 81 is provided, the rotation of the shaft member 81 relative to the exterior case 2 can be prevented by the rotation restricting mechanism 84, so that frictional sound in accordance with rotation of the shaft member 81 relative to the exterior case 2 can be prevented. Further, shaky movement of the shaft member 81 relative to the exterior case 2 in accordance with the friction can also be prevented.

(4) Since the rotation restricting mechanism 84 includes a flat surface 81A formed on the end of the shaft member 81 and a contact surface 83C provided on the screening member 82 to be in contact with the flat surface 81A for restricting the rotation of the shaft member 81, the flat surface 81A can be easily formed by squashing the end of the shaft member 81. Further, since the contact surface 83C in contact with the flat surface 81A is provided on the screening member 82, the structure of the rotation restricting mechanism 84 can be simplified by omitting extra components.

(5) Since the insert hole 82A for the shaft member 81 to be inserted and the fall-out preventing member 83 for preventing the shaft member 81 from dropping out of the insert hole 82A are respectively provided on the screening member 82, the shaft member 81 can be prevented from erroneously dropping off from the insert hole 82A of the screening member 82 by the fall-out preventing member 83, thus preventing the screening member 82 from being detached from the rising portion 222.

(6) Since the fall-out preventing member 83 is made of a flexible member being in contact with the axial end surface of the shaft member 81 and being deformed in attaching the shaft member 81, the attachment process of the screening member 82 to the rising portion 222 and the fall-off preventing member 83 can be simultaneously conducted by attaching the shaft member 81, thereby improving workability.

(7) Since the distal end of the shaft member 81 is squashed to be larger than the shaft diameter to form the flat surface 81A and the position restricting surface 83D to be in contact with the end surface of the shaft end having the flat surface 81A is formed on the fall-out preventing member 83, the flat surface 81A works for restriction in a direction for the shaft member to be inserted to the insert hole 82A and the position restricting surface 83D works for restriction in a direction for the shaft member 81 to go out of the insert hole 82A, thereby simplifying the structure of the screening member 82.

(8) Since the air intake hole 82B for introducing the cooling air into the case is formed on the screening member 82, the cooling air can be introduced into the exterior case 2 through the air intake hole 82B.

Accordingly, the inside of the device can be sufficiently cooled in combination with the cooling means such as the axial flow suction fan 70.

(9) Since the outer surface of the handle 80 and the exterior case 2 are respectively coated and the projecting step portion 80B projecting toward the outer direction relative to the coated surface and having no coating is formed on the handle 80, the sound generated in accordance with friction between the coated surface of the exterior case 2 and the handle 80 can be prevented on the contact surface of the exterior case 2 and the handle 80.

(10) Since the engaging projection 82C to be engaged to the engaging hole 224 of the rising portion 222 is formed on the inner side of the screening member 82, the screening member 82 is engaged to the rising portion 222 after attaching the screening member 82 to the rising portion 222, so that erroneous detachment can be prevented.

Incidentally, the scope of the present invention is not restricted to the aforesaid embodiment but includes modifications and improvements as long as an object of the present invention can be achieved.

For instance, the rotation restricting mechanism 84 may not necessarily be provided in the aforesaid embodiments. When the rotation restricting mechanism 84 is provided, the flat surface 81A may be formed by cutting a part of the circular end of the shaft member 81.

Though the handle 80 is provided with a projecting step portion 80B projecting toward outside direction relative to the coated surface and without being coated, the projecting step portion without being coated may be formed on the rising portion 222 of the exterior case 2 in the present invention.

Two fall-out preventing members 83 may not be provided for a single screening member 82 in the present invention. When the flat surface 81A of the shaft member 81 is enlarged than the shaft diameter, the fall-out preventing member 83 on the side having no flat surface 81A may be omitted. On the contrary, when the fall-out preventing member is provided on two locations, the flat surface 81A of the shaft member 81 may not be larger than the shaft diameter.

Further, though a projector using three optical modulators are exampled in the aforesaid embodiment, the present invention can also be applied to a projector having one optical modulator, a projector having two optical modulators and a projector having more than three optical modulators.

The handle attachment structure of the present invention can also be applied to an electric device other than a projector.

What is claimed is:

1. A handle attachment structure for rotatably attaching a handle to a metal casing formed by sheet metal working, comprising:

a cut-out portion formed by cutting a part of the casing;

a rising portion formed by drawing or bending the casing toward the inside of the casing along the cut periphery of the cut-out portion;

a shaft member inserted to an attachment hole formed on the rising portion for rotatably supporting the handle; and a screening member engaged to the rising portion for covering the cut-out portion from the inside of the casing.

2. The handle attachment structure according to claim 1, wherein the shaft member is made of metal and includes a rotation restricting mechanism for restricting a rotation of the shaft member.

3. The handle attachment structure according to claim 2, the rotation restricting mechanism comprising a flat surface formed on an end of the shaft member and a contact surface formed on the screening member to be in contact with the flat surface for restricting the rotation of the shaft member.

4. The handle attachment structure according to claim 3, wherein the screening member is provided with an insert hole for the shaft member to be inserted and a fall-off preventing member for preventing the shaft member from dropping off the insert hole.

5. The handle attachment structure according to claim 4, wherein the fall-off preventing member including a flexible member being in contact with axial end surface of the shaft member and deforming toward outside in radial direction when the shaft member is attached.

6. The handle attachment structure according to claim 5, wherein the flat surface of the shaft member is formed by squashing the distal end of the shaft member to be larger than the shaft diameter thereof, and wherein the fall-off preventing member includes a position restricting surface to be in contact with the end surface of the distal end of the shaft formed with the flat surface.

7. The handle attachment structure according to claim 1, wherein an air intake hole for introducing cooling air into the casing is provided to the screening member.

8. The handle attachment structure according to claim 1, wherein the outer surfaces of the handle and the casing are respectively coated and a projecting step portion projecting toward outer direction relative to the coated surface and having no coating is formed on at least one of the handle and a portion of the casing to be engaged to the handle.

9. A projector comprising a handle attachment structure according to claim 1.

10. The projector according to claim 9, wherein the shaft member is made of metal and includes a rotation restricting mechanism for restricting a rotation of the shaft member.

11. The projector according to claim 10, the rotation restricting mechanism comprising a flat surface formed on an end of the shaft member and a contact surface formed on the screening member to be in contact with the flat surface for restricting the rotation of the shaft member.

12. The projector according to claim 11, wherein the screening member is provided with an insert hole for the shaft member to be inserted and a fall-off preventing member for preventing the shaft member from dropping off the insert hole.

13. The projector according to claim 12, wherein the fall-off preventing member including a flexible member being in contact with axial end surface of the shaft member and deforming toward outside in radial direction when the shaft member is attached.

14. The projector according to claim 13, wherein the flat surface of the shaft member is formed by squashing the distal end of the shaft member to be larger than the shaft diameter thereof, and wherein the fall-off preventing member includes a position restricting surface to be in contact with the end surface of the distal end of the shaft formed with the flat surface.

15. The projector according to claim 9, wherein an air intake hole for introducing cooling air into the casing is provided to the screening member.

16. The projector according to claim 9, wherein the outer surfaces of the handle and the casing are respectively coated and a projecting step portion projecting toward outer direction relative to the coated surface and having no coating is formed on at least one of the handle and a portion of the casing to be engaged to the handle.

* * * * *